(12) United States Patent  
Freebern et al.

(10) Patent No.: US 7,894,283 B2
(45) Date of Patent: Feb. 22, 2011

(54) INTEGRATED CIRCUIT INCLUDING SELECTABLE ADDRESS AND DATA MULTIPLEXING MODE

(75) Inventors: Margaret Freebern, Richmond, VT (US); Wolfgang Hokenmaier, Lausanne (CH); Donald Labrecque, Colchester, VT (US); Steffen Loeffler, Cary, NC (US); Ralf Klein, Deidesheim (DE)

(73) Assignee: Qimonda AG, München (DE)

( * ) Notice: Subject to any disclaimer, the term of this patent is extended or adjusted under 35 U.S.C. 154(b) by 134 days.

(21) Appl. No.: 12/188,558

(22) Filed: Aug. 8, 2008

(65) Prior Publication Data

US 2010/0034038 A1   Feb. 11, 2010

(51) Int. Cl.
*G11C 11/00*   (2006.01)

(52) U.S. Cl. .................................. 365/201; 365/189.05

(58) Field of Classification Search ............... 365/201, 365/189.05
See application file for complete search history.

(56) References Cited

U.S. PATENT DOCUMENTS

| 5,699,317 | A * | 12/1997 | Sartore et al. | 365/230.06 |
| 6,813,193 | B2 * | 11/2004 | Vogelsang | 365/189.05 |
| 2006/0133126 | A1 * | 6/2006 | Fujisawa et al. | 365/63 |
| 2007/0157000 | A1 * | 7/2007 | Qawami et al. | 711/170 |

* cited by examiner

*Primary Examiner*—Michael T Tran
(74) *Attorney, Agent, or Firm*—Coats & Bennett, P.L.L.C.

(57) ABSTRACT

An integrated circuit includes a memory array, first pads, and second pads. The integrated circuit is configured to operate in a first mode and in a second mode. The first mode includes receiving data signals on the first pads and address signals on the second pads to access the memory array. The second mode includes receiving multiplexed data signals and address signals on the first pads to access the memory array.

24 Claims, 5 Drawing Sheets

INTEGRATED CIRCUIT INCLUDING SELECTABLE ADDRESS AND DATA MULTIPLEXING MODE

BACKGROUND

Typically, a computer system includes a number of integrated circuit chips that communicate with one another to perform system applications. Often, the computer system includes a controller, such as a microprocessor, and one or more memory chips, such as random access memory (RAM) chips. The RAM chips can be any suitable type of RAM, such as dynamic RAM (DRAM), double data rate synchronous DRAM (DDR-SDRAM), graphics DDR-SDRAM (GDDR-SDRAM), and pseudo static RAM (PSRAM). The controller and RAM communicate data with one another to perform system applications.

Some computer systems include mobile applications and have limited space and limited power resources. In mobile applications, such as cellular telephones and personal digital assistants (PDAs), memory cell density and power consumption are issues for future generations. To address these issues, the industry is developing RAM for mobile applications. One type of RAM, referred to as CellularRAM, is a high performance and low power memory designed to meet memory density and bandwidth demands of future generations. CellularRAM is a PSRAM that offers static RAM (SRAM) pin and function compatibility, external refresh-free operation, and a low power design. CellularRAM devices are drop-in replacements for most asynchronous low power SRAMs used in mobile applications, such as cellular telephones. Typically, a PSRAM is based on a DRAM that provides significant advantages in density and speed over traditional SRAM.

The size of personal and portable electronics for consumer and mobile applications continues to decrease. To meet the demand for smaller devices, producers of the devices continue to pursue smaller designs. Producers have achieved smaller designs by reducing the size of chips used within the devices and by combining chips used within the devices into multi-chip packages. Yet there is a continuing demand for even smaller products.

For these and other reasons, there is a need for the present invention.

SUMMARY

One embodiment provides an integrated circuit. The integrated circuit includes a memory array, first pads, and second pads. The integrated circuit is configured to operate in a first mode and in a second mode. The first mode includes receiving data signals on the first pads and address signals on the second pads to access the memory array. The second mode includes receiving multiplexed data signals and address signals on the first pads to access the memory array.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
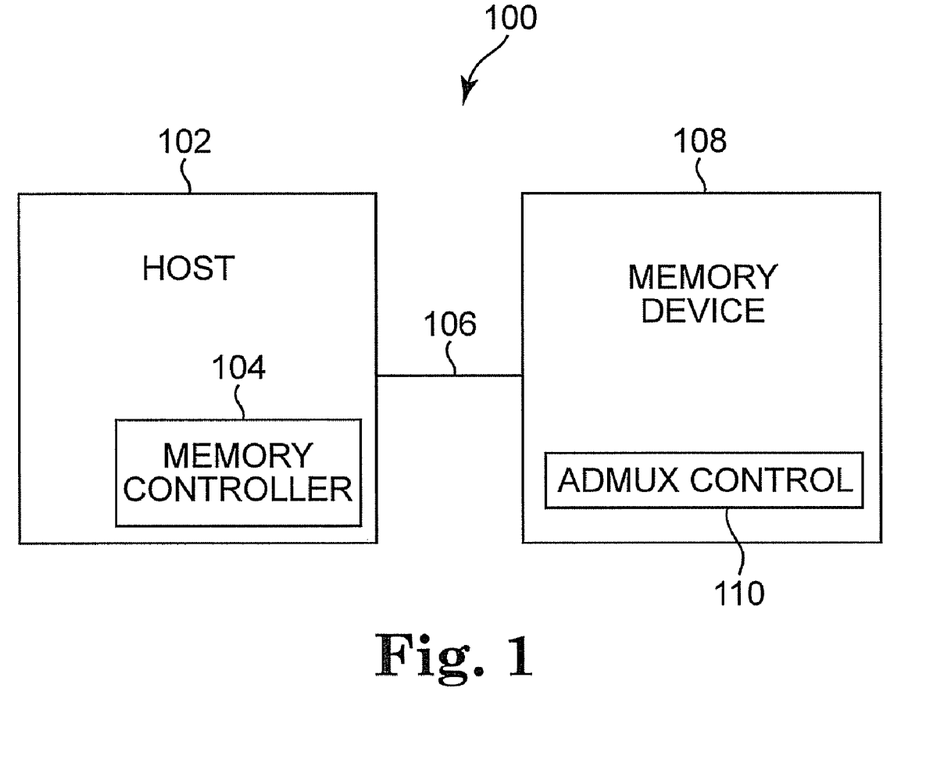
FIG. 1 is a block diagram illustrating one embodiment of a system.

FIG. 1 is a block diagram illustrating one embodiment of a system 100. System 100 includes a host 102 and a memory device 108. Host 102 is communicatively coupled to memory device 108 through communication link 106. Host 102 includes a microprocessor, computer (e.g., desktop, laptop, handheld), portable electronic device (e.g., cellular phone, personal digital assistant (PDA), MP3 player, video player, digital camera), or any other suitable device that uses memory. Memory device 108 provides memory for host 102. In one embodiment, memory device 108 includes a dynamic random access memory (DRAM) device, such as a pseudo static RAM (PSRAM), CellularRAM, or other suitable memory device.

Host 102 includes a memory controller 104. Memory controller 104 includes a microprocessor, microcontroller, or other suitable logic circuitry for controlling the operation of memory device 108. Memory controller 104 passes data to write to memory device 108 and receives data read from memory device 108 through communication link 106. Memory controller 104 provides address and control signals to memory device 108 through communication link 106 to access memory device 108 for read and write operations.

In one embodiment, memory device 108 is an integrated circuit or part of an integrated circuit. Memory device 108 includes an address and data multiplexing (ADMUX) control circuit 110. ADMUX control circuit 110 enables or disables an ADMUX mode of memory device 108. With the ADMUX mode disabled, data signals are passed to data pads or pins of memory device 108 and address signals are passed to separate address pads or pins of memory device 108 through communication link 106. In addition, in one embodiment with the ADMUX mode disabled, a page mode of memory device 108 is enabled.

With the ADMUX mode enabled, time-multiplexed data signals and address signals are passed to a single set of address/data pads or pins of memory device 108 and the unused address pads or pins are disabled to conserve power. During a first period, the address/data pads or pins receive address signals and during a second period, the address/data pads or pins receive data signals indicating data to be written to the received addresses. Therefore, with the ADMUX mode enabled, the number of pads or pins used by memory device 108 is reduced. By reducing the number of pads or pins used by memory device 108 with the ADMUX mode enabled, the size of communication link 106 can be reduced, thus the size of host 102 may also be reduced. In addition, in one embodiment with the ADMUX mode enabled, the page mode of memory device 108 is disabled.

In one embodiment, the ADMUX mode is enabled or disabled by a bond option of memory device 108. In other embodiments, the ADMUX mode is enabled or disabled using another suitable method. In one embodiment, an external or internal signal is provided to ADMUX control circuit 110 to invert the ADMUX mode selection such that memory device 108 can be operated or tested with ADMUX mode enabled or disabled independent of the bond option.

As used herein, the term "electrically coupled" is not meant to mean that the elements must be directly coupled together and intervening elements may be provided between the "electrically coupled" elements.

Figure 2:
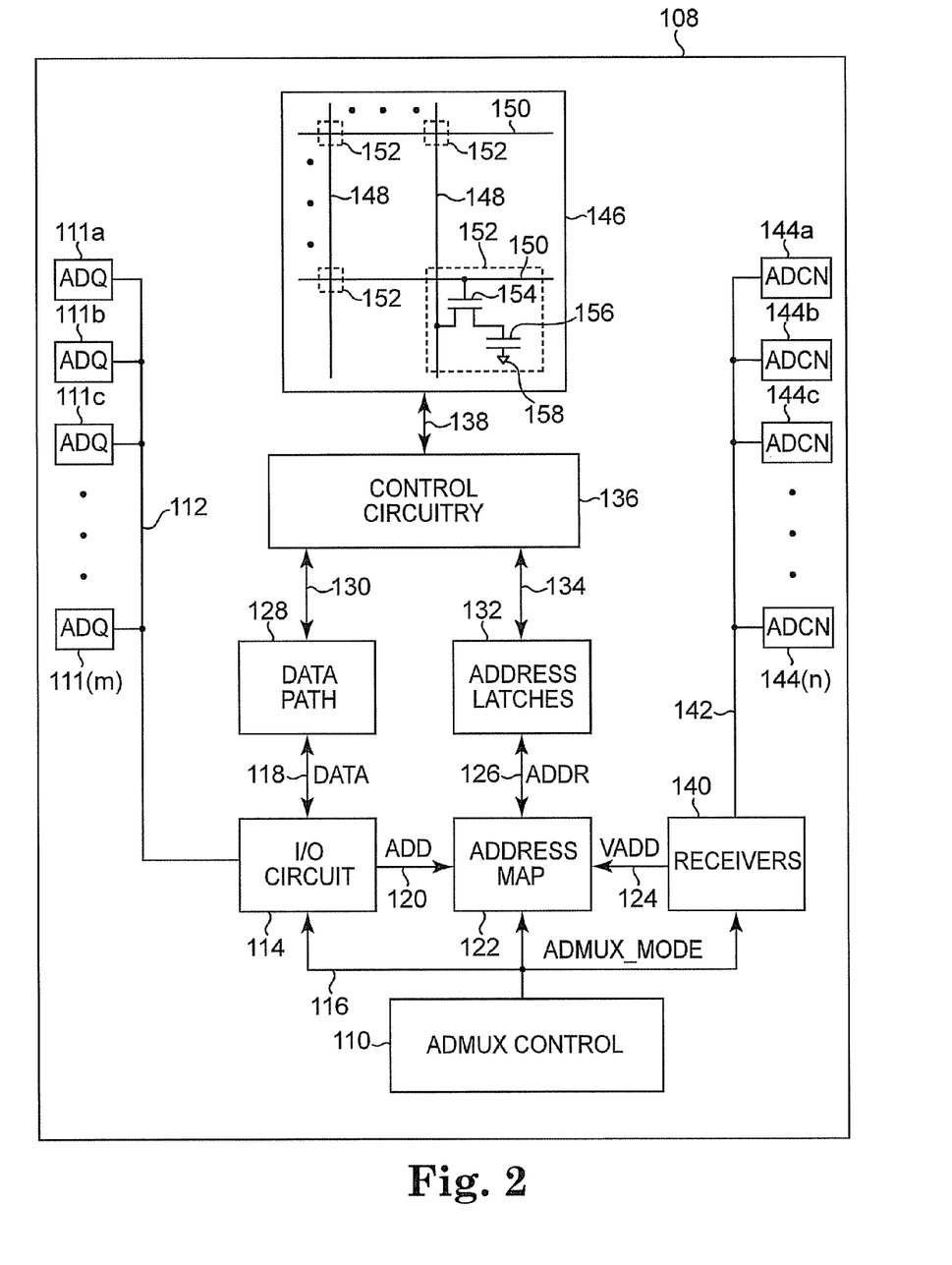
FIG. 2 is a diagram illustrating one embodiment of a memory device.

FIG. 2 is a diagram illustrating one embodiment of memory device 108. Memory device 108 includes input/output pads or address/data (ADQ) pads 111a-111(m) (collectively referred to as ADQ pads 111), where "m" is any suitable number of pads for transferring data to and from memory device 108, such as 16. Memory device 108 includes input pads or address and control (ADCN) pads 144a-144(n) (collectively referred to as ADCN pads 144), where "n" is any suitable number of pads for passing control signals and address signals to memory device 108. Memory device 108 also includes ADMUX control circuit 110, an I/O circuit 114, receivers 140, an address map 122, a data path 128, address latches 132, control circuitry 136, and a memory array 146.

The output of ADMUX control circuit 110 is electrically coupled to a first input of I/O circuit 114, a first input of address map 122, and a first input of receivers 140 through ADMUX_MODE signal path 116. I/O circuit 114 is electrically coupled to each ADQ pad 111a-111(m) through bus 112. An output of I/O circuit 114 is electrically coupled to a second input of address map 122 through address (ADD) bus 120. I/O circuit 114 is electrically coupled to data path 128 through data (DATA) bus 118. Data path 128 is electrically coupled to control circuitry 136 through data bus 130.

Each ADCN pad 144a-144(n) is electrically coupled to a second input of receivers 140 through bus 142. An output of receivers 140 is electrically coupled to a third input of address map 122 through VADD bus 124. The output of address map 122 is electrically coupled to the inputs of address latches 132 through ADDR bus 126. The outputs of address latches 132 are electrically coupled to control circuitry 136 through address bus 134. Control circuitry 136 is electrically coupled to memory array 146 through communication link 138.

With ADMUX mode disabled, each ADQ pad 111a-111(m) passes data signals. Each ADQ pad 111a-111(m) passes data signals from memory controller 104 to I/O circuit 114 through bus 112. Each ADQ pad 111a-111(m) also passes data signals from I/O circuit 114 to memory controller 104. With ADMUX mode enabled, each ADQ pad 111a-111(m) passes both data signals and address signals. Each ADQ pad 111a-111(m) receives time-multiplexed address signals and data signals from memory controller 104 and passes the address signals and data signals to I/O circuit 114 through bus 112. Each ADQ pad 111a-111(m) also passes data signals from I/O circuit 114 to memory controller 104.

I/O circuit 114 receives the ADMUX_MODE signal on ADMUX_MODE signal path 116 and the signals on bus 112 to provide data signals on DATA bus 118 and address signals on ADD bus 120. With ADMUX mode disabled as indicated by the ADMUX_MODE signal, I/O circuit 114 receives data signals on bus 112 and passes the data signals to data path 128 through DATA bus 118. With ADMUX mode enabled as indicated by the ADMUX_MODE signal, I/O circuit 114 receives data signals and address signals on bus 112. I/O circuit 114 passes the data signals to data path 128 through DATA bus 118 and the address signals to address map 122 through ADD bus 120. By using both ADD bus 120 and DATA bus 118 in place of a multi-function bus for both address signals and data signals, bus contention and directional switching delays are avoided.

With ADMUX mode disabled, each ADCN pad 144a-144(n) passes address or control signals. Each ADCN pad 144a-144(n) passes address or control signals from memory controller 104 to receivers 140 through bus 142. With ADMUX mode enabled, at least a portion of ADCN pads 144a-144(n) used for passing address signals are not used. The least significant address signals are provided to ADQ pads 111a-111(m) such that an equal number of ADCN pads 144a-144(m) are not used. For example, in one embodiment, where "m" equals 16 such that there are 16 ADQ pads, 16 ADCN pads 144 are not used with ADMUX mode enabled.

Receivers 140 receive the ADMUX_MODE signal on ADMUX_MODE signal path 116 and the address and control signals on bus 142 to provide address signals on VADD bus 124. With ADMUX mode disabled as indicated by the ADMUX_MODE signal, receivers 140 are enabled and receive address signals on bus 142 and pass the address signals to address map 122 through VADD bus 124. With ADMUX mode enabled as indicated by the ADMUX_MODE signal, at least the least significant address signal receivers are disabled to conserve power.

In one embodiment, the number of ADQ pads 111 is large enough to receive entire addresses and therefore all the address signal receivers are disabled. In this embodiment, receivers 140 do not provide any address signals on VADD bus 124. In another embodiment, the number of ADQ pads 111 is not large enough to receive entire addresses and therefore the most significant address signal receivers are not disabled. In this embodiment, receivers 140 pass the most significant address signals to address map 122 through VADD bus 124.

Address map 122 receives the ADMUX_MODE signal on ADMUX_MODE signal path 116, the address signals on ADD bus 120, and the address signals on VADD bus 124 to provide address signals on ADDR bus 126. With ADMUX mode disabled as indicated by the ADMUX_MODE signal, address map 122 passes the address signals on VADD bus 124 to address latches 132 through ADDR bus 126. With ADMUX mode enabled as indicated by the ADMUX_MODE signal, address map 122 passes the address signals on ADD bus 120 to address latches 132 through ADDR bus 126. In one embodiment, where the number of ADQ pads 111 is not large enough to receive entire addresses, address map 122 also passes the most significant address signals on VADD bus 124 to address latches 132 through ADDR bus 126.

Address latches 132 receive the address signals on ADDR bus 126 and latch and pass the address signals to control circuitry 136 through address bus 134. Data path 128 passes data signals between I/O circuit 114 and control circuitry 136 through data bus 118 and data bus 130, respectively.

Control circuitry 136 receives the data signals on data bus 130 and the address signals on address bus 134 and controls the writing of data to memory array 146 through communication link 138. Control circuitry 136 controls the reading of data from memory array 146 through communication link 138 and passes the data read from memory array 146 to data path 128 through data bus 130. In one embodiment, control circuit 136 includes a column address decoder, a row address decoder, sense amplifiers, and other suitable circuitry for reading data from and writing data to memory array 146.

Memory array 146 includes a plurality of bit lines 148 and a plurality of word lines 150. At the intersection of each bit line 148 and each word line 150 is a memory cell 152. Each memory cell 152 includes a transistor 154 and a capacitor 156. The gate of each transistor 154 is electrically coupled to a word line 150. One side of the drain-source path of each transistor 154 is electrically coupled to a bit line 148. The other side of the drain-source path of each transistor 154 is electrically coupled to one side of a capacitor 156. The other side of each capacitor 156 is electrically coupled to a common or ground 158. Each capacitor 156 is charged and discharged to represent a logic "0" or a logic "1".

During a read operation, a selected word line 150 is activated to turn on a selected transistor 154 and the value stored on a selected capacitor 156 is read by control circuitry 136 via a selected bit line 148. During a write operation, a selected word line 150 is activated to turn on a selected transistor 154 to access a selected capacitor 156. Control circuitry 136 drives a selected bit line 148 to write a data value on the selected capacitor 156 via the selected bit line 148 and the selected transistor 154.

A read operation on a memory cell 152 is a destructive read operation. After each read operation, the selected capacitor 156 is recharged or discharged to the data value that was just read. In addition, even without read operations, the charge on each capacitor 156 discharges over time. To retain a stored value, each memory cell 152 is refreshed periodically by reading and/or writing each memory cell 152. All memory cells 152 in memory array 146 are periodically refreshed to maintain their values.

Figure 3:
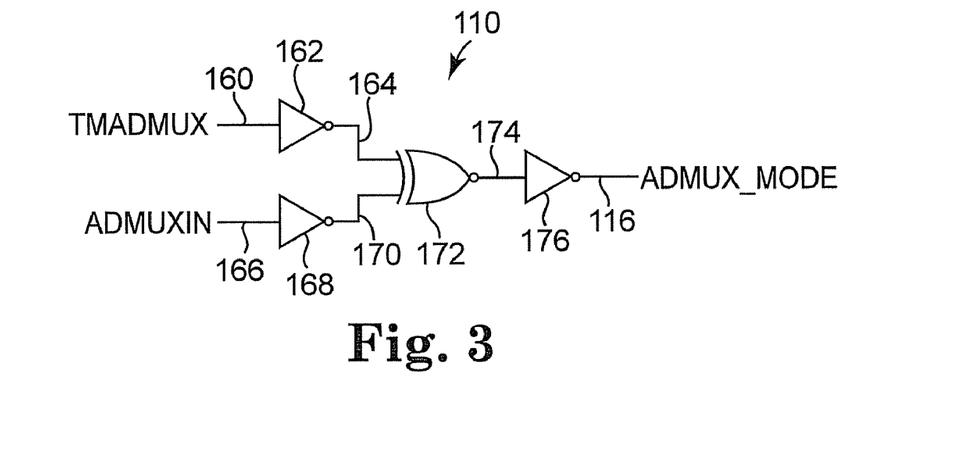
FIG. 3 is a diagram illustrating one embodiment of an address and data multiplexing (ADMUX) control circuit.

FIG. 3 is a diagram illustrating one embodiment of ADMUX control circuit 110. ADMUX control circuit 110 includes inverters 162, 168, and 176 and an XNOR gate 172. The input of inverter 162 receives a test mode address and data multiplexing (TMADMUX) signal on TMADMUX signal path 160. The output of inverter 162 is electrically coupled to a first input of XNOR gate 172 through signal path 164. The input of inverter 168 receives an address and data multiplexing input (ADMUXIN) signal on ADMUXIN signal path 166. The output of inverter 168 is electrically coupled to a second input of XNOR gate 172 through signal path 170. The output of XNOR gate 172 is electrically coupled to the input of inverter 176 through signal path 174. The output of inverter 176 provides the ADMUX_MODE signal on ADMUX_MODE signal path 116.

In one embodiment, the ADMUXIN signal on ADMUXIN signal path 166 is logic high to enable the ADMUX mode and logic low to disable the ADMUX mode. In one embodiment, the ADMUXIN signal is set using a bond option of memory device 108 or by using other suitable method. The TMADMUX signal on TMADMUX signal path 160 is a test mode signal. In one embodiment, the TMADMUX signal is provided to memory device 108 from an external circuit. In another embodiment, the TMADMUX signal is an internally generated signal within memory device 108. The TMADMUX signal is used to invert the ADMUX mode selection.

Inverter 162 inverts the TMADMUX signal on TMADMUX signal path 160 to provide the signal on signal path 164. Inverter 168 inverts the ADMUXIN signal on ADMUXIN signal path 166 to provide the signal on signal path 170. XNOR gate 172 exclusively NORs the signal on signal path 164 and the signal on signal path 170 to provide the signal on signal path 174. Inverter 176 inverts the signal on signal path 174 to provide the ADMUX_MODE signal on ADMUX_MODE signal path 116.

In response to a logic low TMADMUX signal and the logic low ADMUXIN signal, inverter 176 outputs a logic low ADMUX_MODE signal. In response to a logic low TMADMUX signal and a logic high ADMUXIN signal, inverter 176 outputs a logic high ADMUX_MODE signal. In response to a logic high TMADMUX signal and a logic high ADMUXIN signal, inverter 176 outputs a logic low ADMUX_MODE signal. In response to a logic high TMADMUX signal and a logic low ADMUXIN signal, inverter 176 outputs a logic high ADMUX_MODE signal. In one embodiment, a logic high ADMUX_MODE signal enables the ADMUX mode and a logic low ADMUX_MODE signal disables the ADMUX mode.

Figure 4:
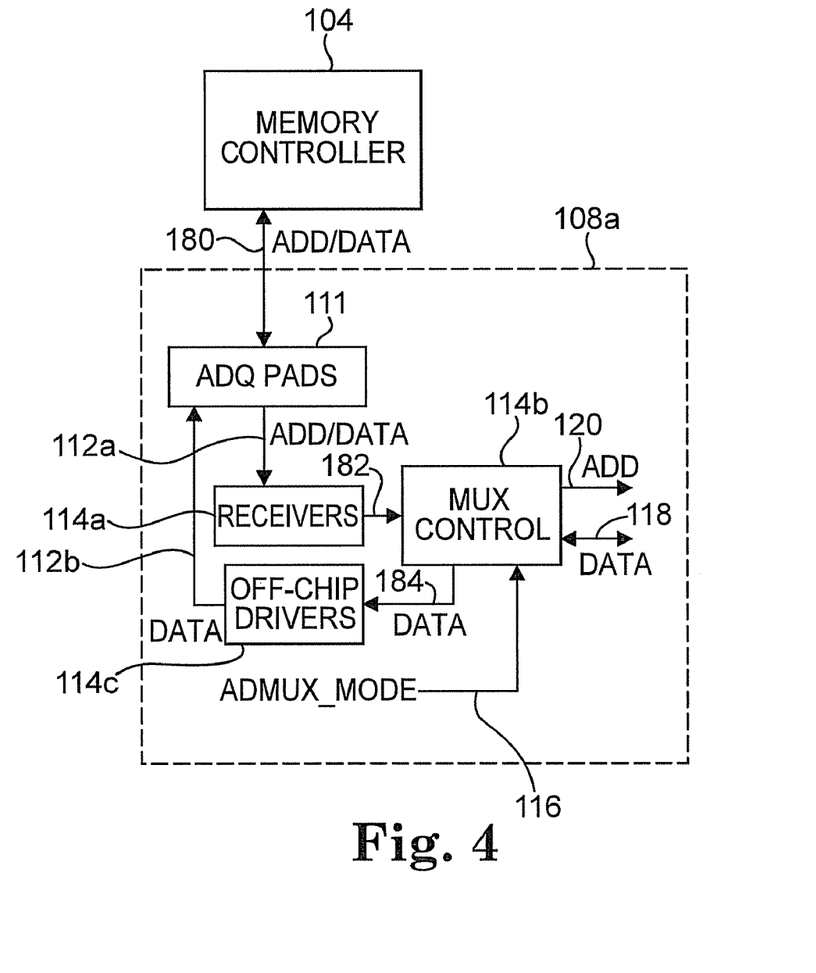
FIG. 4 is a block diagram illustrating one embodiment of a portion of the memory device.

FIG. 4 is a block diagram illustrating one embodiment of a portion 108a of memory device 108. Portion 108a includes ADQ pads 111, receivers 114a, MUX control circuit 114b, and off-chip drivers 114c. In one embodiment, receivers 114a, MUX control circuit 114b, and off-chip drivers 114c are part of I/O circuit 114 previously described and illustrated with reference to FIG. 2. Memory controller 104 is electrically coupled to ADQ pads 111 through ADD/DATA bus 180. In one embodiment, ADD/DATA bus 180 is part of communication link 106 previously described and illustrated with reference to FIG. 1. ADQ pads 111 are electrically coupled to receivers 114a through ADD/DATA bus 112a. ADQ pads 111 are electrically coupled to off-chip drivers 114c through DATA bus 112b. In one embodiment, ADD/DATA bus 112a and DATA bus 112b are part of bus 112 previously described and illustrated with reference to FIG. 2.

Receivers 114a are electrically coupled to MUX control circuit 114b through bus 182. MUX control circuit 114b is electrically coupled to off-chip drivers 114c through DATA bus 184. MUX control circuit 114b receives the ADMUX_MODE signal on ADMUX_MODE signal path 116. MUX control circuit 114b provides address signals on ADD bus 120 and provides and receives data signals on DATA bus 118.

With ADMUX mode disabled, receivers 114a receive data signals on ADD/DATA bus 112a and pass the data signals to MUX control circuit 114b through bus 182. With ADMUX mode enabled, receivers 114a receive time-multiplexed address signals and data signals on ADD/DATA bus 112a and pass the address signals and data signals to MUX control circuit 114b through bus 182.

MUX control circuit 114b receives the ADMUX_MODE signal on ADMUX_MODE signal path 116 and the signals on bus 182 to provide the address signals on ADD bus 120 and the data signals on DATA bus 118. With ADMUX mode disabled as indicated by the ADMUX_MODE signal, MUX control circuit 114b passes data signals on bus 182 to DATA bus 118. With ADMUX mode enabled as indicated by the ADMUX_MODE signal, MUX control circuit 114b passes data signal on bus 182 to DATA bus 118 and passes address signals on bus 182 to ADD bus 120. With ADMUX_MODE disabled or enabled, MUX control circuit 114*b* passes data read from memory array 146 on DATA bus 118 to off-chip drivers 114*c* through DATA bus 184. Off-chip drivers 114*c* drive the data on DATA bus 184 to ADQ pads 111 through data bus 112*b*.

Figure 5:
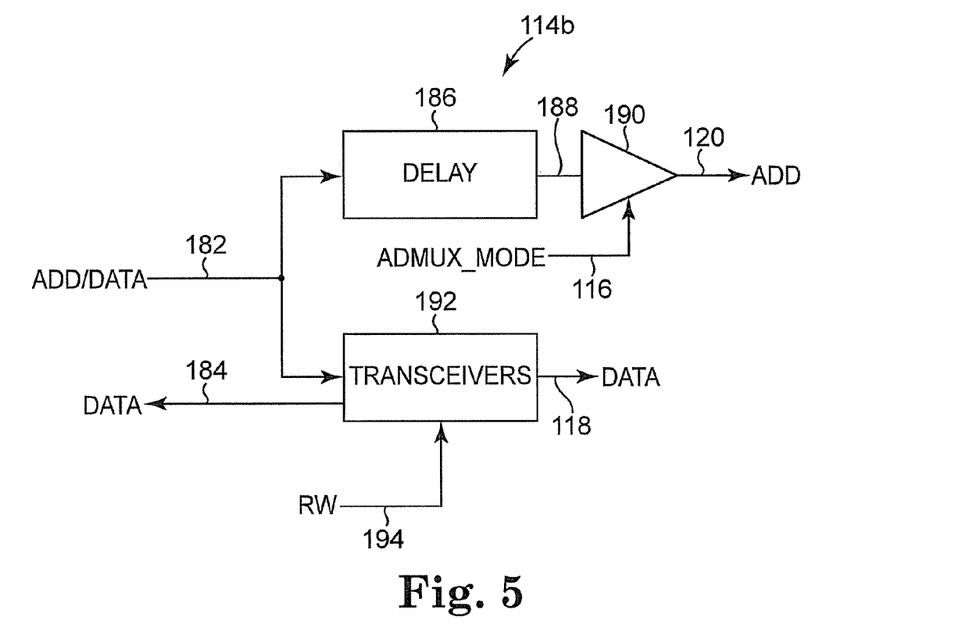
FIG. 5 is a diagram illustrating one embodiment of a multiplexing (MUX) control circuit.

FIG. 5 is a diagram illustrating one embodiment of MUX control circuit 114*b*. MUX control circuit 114*b* includes a delay 186, a tri-state buffer 190, and transceivers 192. The input of delay circuit 186 receives the address signals and data signals on ADD/DATA bus 182. The output of delay 186 is electrically coupled to the input of tri-state buffer 190 through bus 188. Delay 186 delays the signals on ADD/DATA bus 182 to provide signals on bus 188. Delay 186 delays the signals for a time equal to the time the address signals from ADCN pads 144 take to pass through receivers 140 to VADD bus 124.

The control input of tri-state buffer 190 receives the ADMUX_MODE signal on ADMUX_MODE signal path 116. The output of tri-state buffer 190 provides address signals on ADD bus 120. Transceivers 192 receive address signals and data signals on ADD/DATA bus 182. A control input of transceivers 192 receives a read/write (RS) signal on RW signal path 194. Transceivers 192 pass data between DATA bus 118 and DATA bus 184 in response to the RW signal.

With ADMUX mode disabled, the output of tri-state buffer 190 is high impedance and data signals are passed between ADD/DATA bus 182, DATA bus 184, and DATA bus 118 by transceivers 192 in response to the RW signal. With ADMUX mode enabled, tri-state buffer 190 passes the address signals on signal path 188 to ADD bus 120. Data signals are passed between ADD/DATA bus 182, DATA bus 184, and DATA bus 118 by transceivers 192 in response to the RW signal.

Figure 6:
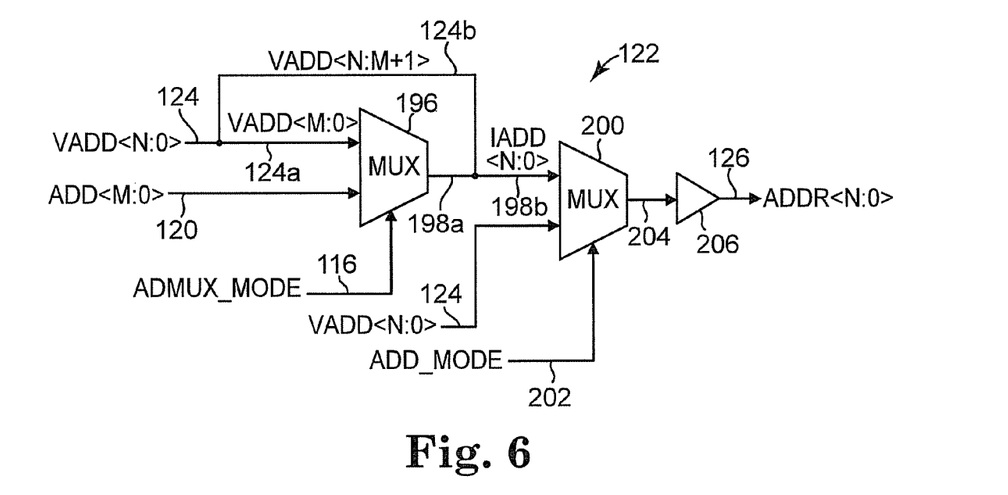
FIG. 6 is a diagram illustrating one embodiment of an address map.

FIG. 6 is a diagram illustrating one embodiment of address map 122. Address map 122 includes a multiplexer 196, an optional multiplexer 200, and a buffer 206. VADD<N:0> bus 124 is divided into VADD<M:0> bus 124*a* and VADD<N:M+1> bus 124*b*. A first input of MUX 196 receives the address signals on VADD<M:0> bus 124*a*. A second input of MUX 196 receives the address signals on ADD<M:0> bus 120. The control input of MUX 196 receives the ADMUX_MODE signal on ADMUX_MODE signal path 116. The output of MUX 196 is electrically coupled to bus 198*a*.

VADD<N:M+1> bus 124*b* is combined with bus 198*a* to provide internal address (IADD<N:0>) bus 198*b*. A first input of optional MUX 200 receives the address signals on IADD<N:0> bus 198*b*. A second input of MUX 200 receives the address signals on VADD<N:0> bus 124. The control input of MUX 200 receives an additional mode (ADD_MODE) signal on ADD_MODE signal path 202. The output of MUX 200 is electrically coupled to the input of buffer 206 through bus 204. The output of buffer 202 provides the address signals on ADDR<N:0> bus 126.

With ADMUX mode disabled as indicated by the ADMUX_MODE signal, MUX 196 passes the address signals on VADD<M:0> bus 124*a* to bus 198*a*. The address signals on VADD<M:0> 124*a* are recombined with the address signals on VADD<N:M+1> bus 124*b* to provide the address signals on IADD<N:0> bus 198*b*. With ADMUX mode enabled as indicated by the ADMUX_MODE signal, MUX 196 passes the address signals on ADD<M:0> bus 120 to bus 198*a*. The address signals on ADD<M:0> bus 120 are combined with the address signals on VADD<N:M+1> bus 124*b* to provide the address signals on IADD<N:0> bus 198*b*.

In one embodiment, the ADD_MODE signal is a test mode signal used for testing memory device 108. With the additional mode disabled as indicated by the ADD_MODE signal, MUX 200 passes the address signals on IADD<N:0> bus 198*a* to bus 204. With the additional mode enabled as indicated by the ADD_MODE signal, MUX 200 passes the address signals on VADD<N:0> bus 124 to bus 204. Buffer 206 buffers the address signals on bus 204 to provide the address signals on ADDR<N:0> bus 126.

In operation, with ADMUX mode disabled and the additional mode disabled, address map 122 passes all the address signals on VADD<N:0> bus 124 to ADDR<N:0> bus 126. With ADMUX mode disabled and the additional mode disabled, address map 122 passes the least significant address signals on ADD<M:0> bus 120 and the most significant address signals on VADD<N:M+1> bus 124*b* to ADDR<N:0> bus 126. With ADMUX mode disabled or enabled and with the additional mode enabled, address map 122 passes all the address signals on VADD<N:0> bus 124 to ADDR<N:0> bus 126.

Figure 7:
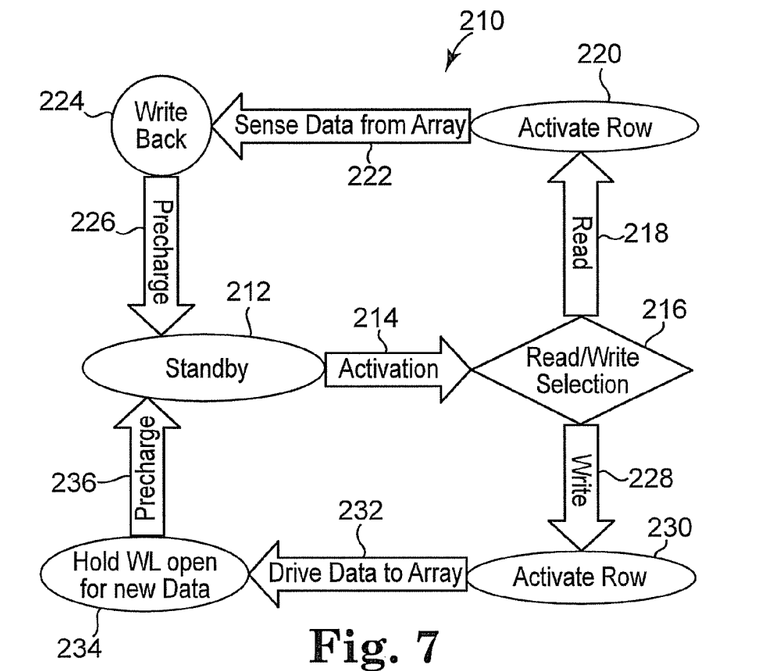
FIG. 7 is a state diagram illustrating one embodiment of the operation of the memory device with an ADMUX mode disabled.

FIG. 7 is a state diagram 210 illustrating one embodiment of the operation of memory device 108 with the ADMUX mode disabled. In this embodiment, the address signals used to address memory array 146 are received on ADCN pads 144. At 212, memory device 108 is in a standby state and waiting for a read or write operation. In response to an activation command at 214 from memory controller 104, the state transitions to decision block 216. At decision block 216, it is determined whether a read operation or a write operation has been selected by memory controller 104.

In response to a read selection at 218 the selected row or word line 150 in memory array 146 is activated at 220. At 222, the data stored in the memory cells 152 along the selected word line 150 is sensed from memory array 146. At 224, the sensed data is written back to memory array 146. At 226, memory array 146 is precharged and memory device 108 returns to the standby state at 212 to await the next read or write operation.

In response to a write selection at 228, the selected row or word line 150 in memory array 146 is activated at 230. At 232, data is driven to memory array 146. At 234, the selected word line 150 is held open and new data is written to the memory cells 152 along the selected word line 150. At 236, memory array 146 is precharged and memory device 108 returns to the standby state at 212 to await the next read or write operation.

Figure 8:
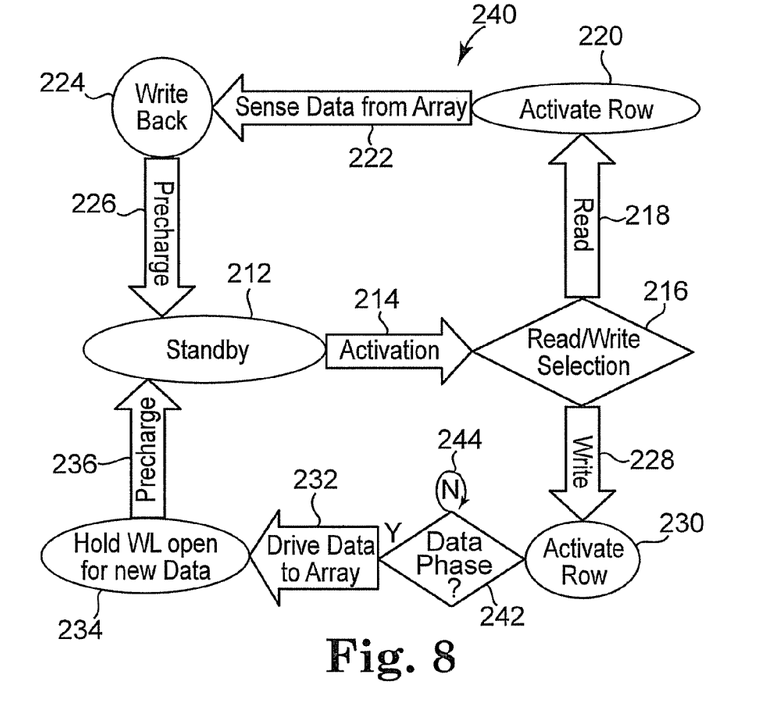
FIG. 8 is a state diagram illustrating one embodiment of the operation of the memory device with the ADMUX mode enabled.

FIG. 8 is a state diagram 240 illustrating another embodiment of the operation of memory device 108 with the ADMUX mode enabled. In this embodiment, the address signals used to address memory array 146 are received on ADQ pads 111 and a portion of ADCN pads 144 (if the number of ADQ pads is not sufficient to receive entire addresses). State diagram 240 is similar to state diagram 210 previously described and illustrated with reference to FIG. 7, except that state diagram 240 includes an additional state at 242.

During a write operation, after activating the selected row or word line 150 in memory array 146 at 230, the state transitions to decision block 242. At decision block 242, it is determined whether memory device 108 is in a data phase and receiving data signals on ADQ pads 111 or in an address phase and receiving address signals on ADQ pads 111. If memory device 108 is in the address phase as indicated at 244, the write operation is delayed until memory device 108 enters the data phase. Once memory device 108 enters the data phase, the data is driven to memory array 146 at 232. In this way, only valid data is written to memory array 146. In one embodiment, memory controller 104 provides a control signal to memory device 108 indicating whether memory controller 104 is providing address signals or data signals to ADQ pads 111.

Embodiments provide an integrated circuit memory device including a memory array and input/output pads for accessing the memory array. In one embodiment with an address and data multiplexing mode disabled, separate input/output pads are used to pass data signals and address signals to the memory device. In another embodiment with the address and data multiplexing mode enabled, some input/output pads are used to pass time-multiplexed data signals and address signals to the memory device. In this embodiment, the unused input/output pads are disabled. By reducing the number of input/output pads used with the address and data multiplexing mode enabled, the number of external connections to the memory device and therefore the size of the host may be reduced. By having the option of enabling or disabling the address and data multiplexing mode, a single integrated circuit can be produced to operate in both modes. Therefore, the cost of producing the integrated circuit is reduced compared to the cost of producing two separate integrated circuits where each integrated circuit operates in only one of the modes.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a memory array;
   first pads;
   second pads,
   wherein the integrated circuit is configured to operate in a first mode and in a second mode, the first mode including receiving data signals on the first pads and address signals on the second pads to access the memory array, the second mode including receiving multiplexed data signals and address signals on the first pads to access the memory array; and
   receivers coupled to the second pads, the receivers configured to be enabled in the first mode and disabled in the second mode.

2. The integrated circuit of claim 1, further comprising:
   a bond option for selecting one of the first mode and the second mode.

3. The integrated circuit of claim 2, further comprising:
   a circuit configured to invert the selection of the bond option in response to an input signal.

4. The integrated circuit of claim 1, wherein the integrated circuit is configured to enable a page mode in the first mode and disable the page mode in the second mode.

5. The integrated circuit of claim 1, wherein the integrated circuit comprises a pseudo static random access memory.

6. An integrated circuit comprising:
   a memory array;
   first pads;
   second pads;
   wherein the integrated circuit is configured to operate in a first mode and in a second mode, the first mode including receiving data signals on the first pads and address signals on the second pads to access the memory array, the second mode including receiving multiplexed data signals and address signals on the first pads to access the memory array; and
   an address map configured to address the memory array using address signals from the second pads in the first mode and to address the memory array using address signals from the first pads in the second mode.

7. The integrated circuit of claim 6, further comprising:
   a data bus configured to pass data signals between the first pads and the memory array;
   a first address bus configured to pass address signals from the second pads to the address map in the first mode; and
   a second address bus configured to pass address signals from the first pads to the address map in the second mode.

8. The integrated circuit of claim 6, further comprising:
   third pads,
   wherein the address map is configured to address the memory array using address signals from the third pads in the first mode and in the second mode.

9. A system comprising:
   a host; and
   a memory device communicatively coupled to the host, the memory device comprising:
   a memory array;
   first pads; and
   second pads,
   wherein the memory device is configured to operate in a first mode and in a second mode, the first mode including receiving data signals on the first pads from the host and address signals on the second pads from the host to access the memory array, the second mode including receiving time-multiplexed data signals and address signals on the first pads from the host to access the memory array,
   wherein the memory device is configured to enable a page mode in the first mode and disable the page mode in the second mode.

10. The system of claim 9, wherein the memory device further comprises:
    a bond option for selecting one of the first mode and the second mode.

11. The system of claim 10, wherein the memory device further comprises:
    a circuit configured to invert the selection of the bond option in response to a test mode signal.

12. The system of claim 9, wherein the memory device further comprises:
    receivers coupled to the second pads, the receivers enabled in the first mode and disabled in the second mode.

13. The system of claim 9, wherein the memory device comprises a cellular random access memory.

14. The system of claim 9, wherein the host comprises a portable electronic device.

15. A system comprising:
    a host; and
    a memory device communicatively coupled to the host, the memory device comprising:
    a memory array;
    first pads; and
    second pads;
    wherein the memory device is configured to operate in a first mode and in a second mode, the first mode including receiving data signals on the first pads from the host and address signals on the second pads from the host to access the memory array, the second mode including receiving time-multiplexed data signals and address signals on the first pads from the host to access the memory array; and
    an address map configured to address the memory array using address signals from the second pads in the first mode and to address the memory array using address signals from the first pads in the second mode.

16. The system of claim 15, wherein the memory device further comprises:
a data bus configured to pass data signals between the first pads and the memory array;
a first address bus configured to pass address signals from the second pads to the address map in the first mode; and
a second address bus configured to pass address signals from the first pads to the address map in the second mode.

17. A method for operating a memory, the method comprising:
providing a memory including a memory array, first pads, and second pads;
configuring the memory to operate in one of a first mode and a second mode;
receiving data signals on the first pads and address signals on the second pads to access the memory array in response to configuring the memory to operate in the first mode;
receiving multiplexed data signals and address signals on the first pads to access the memory array in response to configuring the memory to operate in the second mode;
enabling receivers coupled to the second pads in response to configuring the memory to operate in the first mode; and
disabling the receivers coupled to the second pads in response to configuring the memory to operate in the second mode.

18. The method of claim 17, wherein configuring the memory comprises setting a bond option to configure the memory to operate in one of the first mode and the second mode.

19. The method of claim 18, further comprising:
testing the memory in the other of the first mode and the second mode opposite the mode configured by the bond option.

20. The method of claim 17, further comprising:
enabling a page mode of the memory in response to configuring the memory to operate in the first mode; and
disabling the page mode of the memory in response to configuring the memory to operate in the second mode.

21. The method of claim 17, wherein configuring the memory comprises configuring a cellular random access memory.

22. A method for operating a memory, the method comprising:
providing a memory including a memory array, first pads, and second pads;
configuring the memory to operate in one of a first mode and a second mode;
receiving data signals on the first pads and address signals on the second pads to access the memory array in response to configuring the memory to operate in the first mode;
receiving multiplexed data signals and address signals on the first pads to access the memory array in response to configuring the memory to operate in the second mode;
passing data signals on the first pads to the memory array through a data bus;
passing address signals on the second pads through a first address bus to access the memory array in response to configuring the memory to operate in the first mode;
passing address signals on the first pads through a second address bus to access the memory array in response to configuring the memory to operate in the second mode;
enabling a page mode of the memory in response to configuring the memory to operate in the first mode; and
disabling the page mode of the memory in response to configuring the memory to operate in the second mode.

23. The method of claim 22, further comprising:
enabling receivers coupled to the second pads in response to configuring the memory to operate in the first mode; and
disabling the receivers coupled to the second pads in response to configuring the memory to operate in the second mode.

24. A memory comprising:
an array of dynamic random access memory cells;
first input/output pads;
second input pads;
a bond option for selecting one of a first mode and a second mode for operating the memory, the first mode including receiving data signals on the first input/output pads and address signals on the second input pads to access the array, the second mode including receiving time-multiplexed data signals and address signals on the first input/output pads to access the array;
an address map configured to address the array using address signals from the second input pads in the first mode and to address the memory array using address signals from the first input/output pads in the second mode;
a data bus configured to pass data signals between the first input/output pads and the array;
a first address bus configured to pass address signals from the second input pads to the address map in the first mode; and
a second address bus configured to pass address signals from the first input/output pads to the address map in the second mode.

* * * * *